(12) United States Patent
Stolze et al.

(10) Patent No.: US 7,701,054 B2
(45) Date of Patent: Apr. 20, 2010

(54) POWER SEMICONDUCTOR MODULE AND METHOD FOR ITS MANUFACTURE

(75) Inventors: Thilo Stolze, Arnsberg (DE); Klaus Schiess, Allensbach (DE); Peter Kanschat, Bad Sassendorf (DE)

(73) Assignee: Infineon Technologies AG, Munich (DE)

( * ) Notice: Subject to any disclaimer, the term of this patent is extended or adjusted under 35 U.S.C. 154(b) by 276 days.

(21) Appl. No.: 11/673,929

(22) Filed: Feb. 12, 2007

(65) Prior Publication Data

US 2008/0191340 A1 Aug. 14, 2008

(51) Int. Cl.
*H01L 23/10* (2006.01)

(52) U.S. Cl. .................. 257/706; 257/699; 257/712; 257/730; 257/E23.128

(58) Field of Classification Search .............. 257/687, 257/730, 773, 787, 795, 699, 675, 705, 706, 257/712, 718, 733
See application file for complete search history.

(56) References Cited

U.S. PATENT DOCUMENTS

| | | | |
|---|---|---|---|
| 6,281,579 B1 * | 8/2001 | Siu | 257/730 |
| 6,836,005 B2 * | 12/2004 | Moriwaki | 257/678 |
| 6,858,467 B2 * | 2/2005 | Moden | 438/107 |
| 2004/0173881 A1 * | 9/2004 | Harnden et al. | 257/666 |

* cited by examiner

*Primary Examiner*—Wai-Sing Louie
(74) *Attorney, Agent, or Firm*—Coats & Bennett, P.L.L.C.

(57) ABSTRACT

A power semiconductor module 3 for mounting on a cooling element 4 has at least one substrate 2, on which one or more components 5, 6, 7 are mounted and a module housing 40. The module housing 40 surrounds at least partially the at least one substrate 2. The module housing 40 has opposite sides with a first side facing the cooling element 4, and a second side 42 having one or more openings and a surface turned away from the power semiconductor module 3. Each of the one or more openings has a border, which is sealed by an internal contact 16, 17, 18, 27, 28, which is electrically connected to the one or more components 5, 6, 7. The internal contact protrudes the module housing 40, such that the internal contact not extends beyond said surface of the second side 42 of the module housing 40.

17 Claims, 5 Drawing Sheets

POWER SEMICONDUCTOR MODULE AND METHOD FOR ITS MANUFACTURE

TECHNICAL FIELD

The present invention relates to a power semiconductor module for mounting on a cooling element comprising at least one substrate, on which one or more components are mounted, and a module housing at least partially surrounding the at least one substrate.

BACKGROUND

Power semiconductor modules comprise a semiconductor package and at least two semiconductor chips mounted on one or more substrates in the package. The power semiconductor chips usually comprise power electronic circuits such as rectifier bridges, DC-links, Insulated Gate Bipolar Transistor (IGBT) inverters, drivers, control units, sensing units, half bridge inverters, AC-DC converter, DC-AC converters, DC-DC converters, bidirectional high bridge switches, and more.

Modern power semiconductor modules commonly use leadframes for external contact. The leadframe is electrically contacted to the substrate whereon each of the internal contacts of the semiconductor chips are connected to the leads of the leadframe. For an extended circuit area on the substrate the lead contacts are electrically connected exclusively to the sides of the substrate. A technique for the enclosure of semiconductor modules is the Insert-Mold-Technique (IMT) wherein the semiconductor chips mounted on one or more substrates are molded in a housing of a synthetic material. In case of the manufacture of an IMT-module housing, the leads of the leadframe extending away from the substrate are connected by a circumferential leadframe bar acting as a sealing interface between an upper and lower die during the IMT-manufacturing process.

For electrical isolation and mechanical protection, the power semiconductor modules are encapsulated. After completion of the module housing, the power semiconductor module is mounted on a cooling element for dissipating excess heat of the semiconductor chips generated during operation. An effective thermal contact is achieved by closely mounting a large area of the power semiconductor module, e.g. the bottom side of the module, onto a surface of the cooling element acting as a heat sink.

To reduce the costs of the synthetic module housing material the body of the power semiconductor module usually has a flat shape. This shape leads to small heights of the power semiconductor modules resulting in small distances between the top side of the power semiconductor module and the cooling element where the module is mounted on.

The afore mentioned leadframe contacts protrude the module housing on the sides of the power semiconductor module body. Due to the flat shape of the power semiconductor module, the small distance of the electrical contacts to the cooling element, often just a few millimeters, result in small creepage distances and air gaps between the electrical contacts of the power semiconductor module and the cooling element. The use of conventional power semiconductor modules is thus limited to reverse voltages of approximately 600 V. For operation at higher reverse voltages, particularly in the widely used reverse voltage class of 1200 V, additional measures and efforts are required for a reliable operation of these power semiconductor modules. There is a general need to provide power semiconductor modules for operation at reverse voltages beyond 600 V without the need of subsequent time and effort consuming treatments of the modules.

SUMMARY

According to an embodiment, a power semiconductor module for mounting on a cooling element may comprise at least one substrate, on which one ore more components are mounted, is disclosed herein, which comprises a module housing at least partially surrounding the at least one substrate, in which the module housing has opposite sides with a first side facing the cooling element, and a second side having one or more openings and a surface turned away from the power semiconductor module, wherein each of the one or more openings has a border, which is sealed by one internal contact, which is electrically connected to the one or more components and protrudes the module housing, such that the one internal contact not extends beyond said surface of the second side of the module housing.

BRIEF DESCRIPTION OF THE DRAWINGS

The power semiconductor module, according to different embodiments, can be better understood with references to the following drawings and description. The components in the Figures are not necessarily to scale, instead emphases is placed upon illustrating the principles of a module according to different embodiments. Moreover, in the Figures, like reference numerals designate corresponding parts. In the drawings.

DETAILED DESCRIPTION

Figure 1:
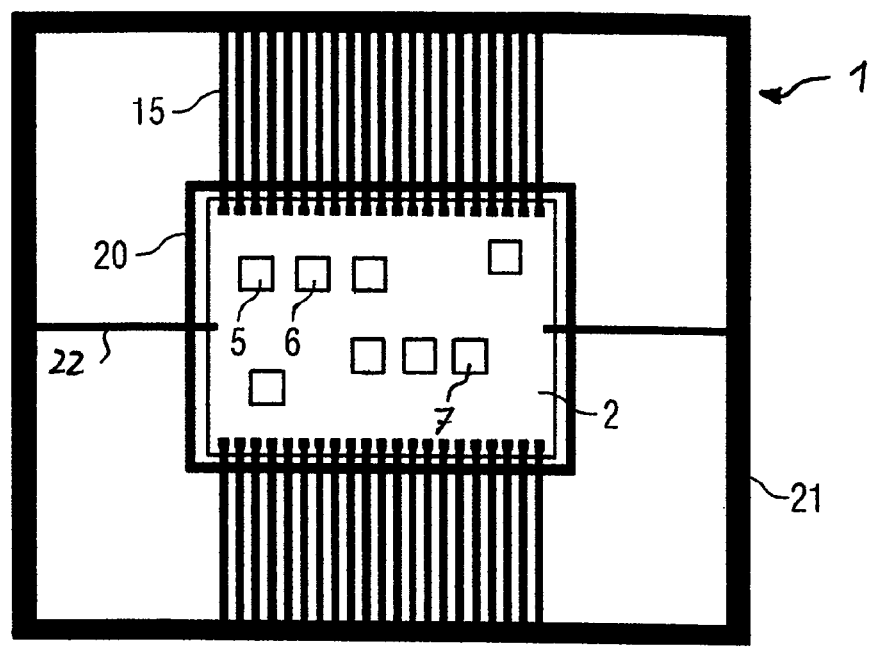
FIG. 1 is a plan view of a leadframe with a substrate including power semiconductor devices prior to a molding procedure.

According to another embodiment, a method for manufacturing a power semiconductor module may comprise the steps of providing at least one substrate on which one ore more components are mounted; putting the substrate on a leadframe having a circumferential bar at the sealing edge of the molding apparatus; forming at least one internal contact out of the leadframe or by providing at least one additional contact onto the substrate; putting the leadframe comprising a substrate with and the components into a lower die of the molding apparatus having an upper and a lower die; putting a foil at least onto the internal contacts for protecting the surfaces of the internal contacts; moving the lower die and the upper die relative to one another; forming the module housing out of a mold with opposite sides; a first side facing the cooling element, and a second side having one or more openings and a surface turned away from the power semiconductor module, wherein each of the one or more openings has a border, which is sealed by one internal contact, which is electrically connected to the one or more components and protrudes the module housing, such that the one internal contact not extends beyond said surface of the second side of the module housing.

A structure of a common semiconductor module and an arrangement of the module onto a cooling element is shown in FIGS. 1 to 5. According to an embodiment, a substrate 2 may be a leadframe, insulated metal substrate (IMS) or a ceramic substrate using a material for example of $AL_2O_3$, HPS $AL_2O_3$, ALN or $Si_3N_4$. According to some embodiments, the substrate 2 may as well be a direct copper bonding (DCB) substrate with a ceramic core covered by a metallization material as copper, aluminum or any other kind of commonly used metal. Other substrate types, such as active metal brazing (AMB) substrates, direct aluminum bonding (DAB) substrates or regular brazing substrates may alternatively be used. According to an embodiment, power semiconductor devices 5, 6, 7 are mounted onto the substrate 2. According to some embodiments, the power semiconductor devices 5, 6, 7 are usually soldered onto the substrate. The external wiring of the substrate 2 can be done via a plurality of electrical contacts 15. The contacts 15 of the leadframe 1 are electrically connected to electrical contacts at the longitudinal edges of the substrate 2.

It is also possible, according to an embodiment, instead of using the substrate 2 with power semiconductor devices 5, 6, 7, to electrically connect the power semiconductor devices directly to a leadframe. Besides the electrical contacts 15, according to an embodiment, which electrically connect all the contacts of the substrate when the leadframe is mounted onto the substrate, the leadframe 1 additionally comprises circumferential bars 20, 21. The bars mechanically stabilize the electrical contacts 15. According to an embodiment, the bars 20, 21 are mechanically stabilized relative to one another by additional bars 22 being connected to the substrate 2 as well. According to an embodiment, electrical contacts of the substrate 2 are connected to the electrical contacts 15 of the leadframe 1 at the longitudinal edges. The electrical connection is done by soldering, welding, using an adhesive or any other conductive connection technique.

Figure 2:
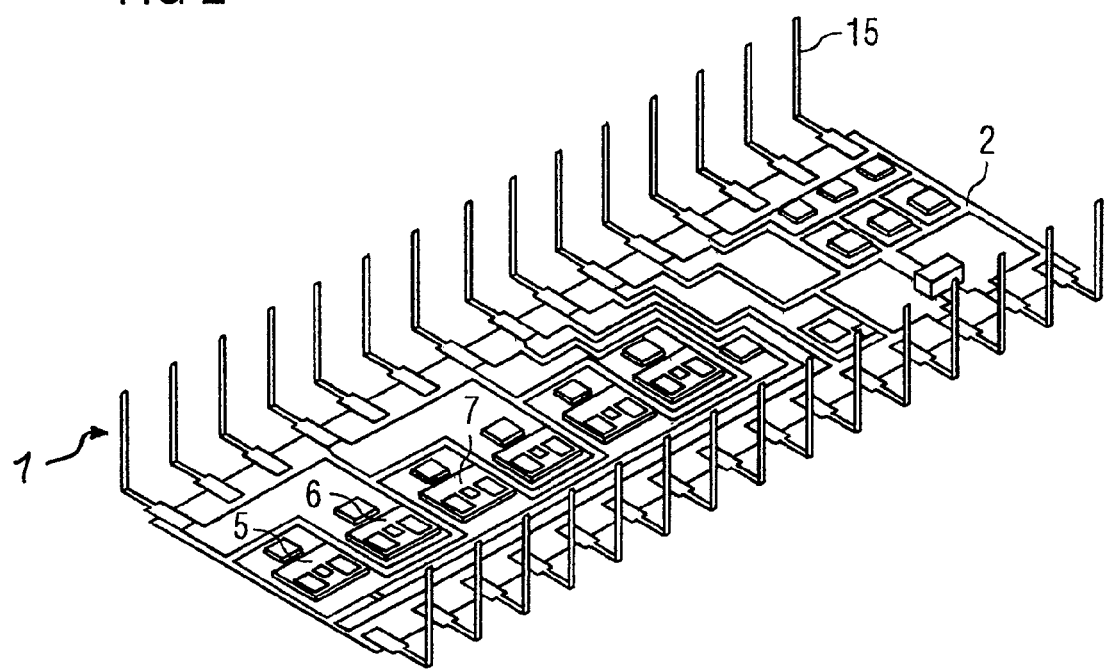
FIG. 2 is a 3D-view of a leadframe including a substrate and power semiconductor devices without a module housing.

A substrate 2 including power semiconductor devices 5, 6, 7 and electrical contacts 15 of a leadframe being connected to the substrate 2 is depicted in FIG. 2 without a module housing. The circumferential bars 20, 21 and the supporting bars 22 of the leadframe 1 are removed.

Figure 3:
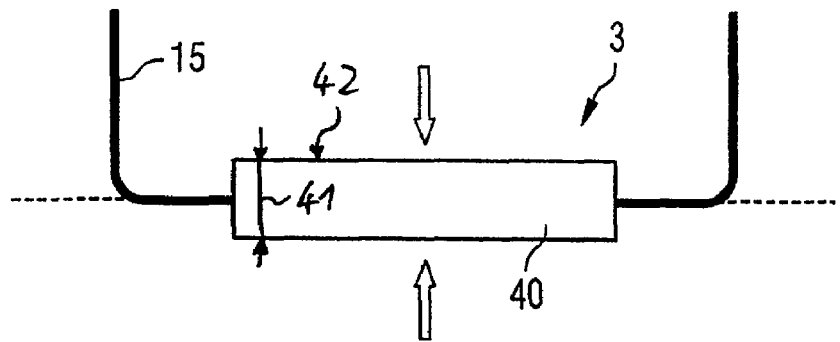
FIG. 3 is a cross sectional view of a power semiconductor module including a leadframe during the molding procedure.

According to an embodiment, for encapsulating the power semiconductor module, the leadframe 1, as shown in FIG. 3, is Insert-Molded into a synthetic material. During the molding process, the die disconnection of the die cast seals over the circumferential bar 20 of the leadframe 1. Simultaneously, the circumferential bar 20 stabilizes and aligns the electrical contacts 15 during the molding procedure. For sealing of the die cast, after closing of die (see arrows in FIG. 3), the cast disconnection follows a defined area (see dashed line in FIG. 3), corresponding to the circumferential bar 20 of the leadframe 1. The Insert-Mold-procedure results in a power semiconductor module 3 being encapsulated in a module housing 40 of a height 41 having a housing surface 42 and electrical contacts 15 leaving the module housing at the die disconnection located at the circumferential bar 20.

According to an embodiment, following the molding, parts of the electrical contacts 15 not used by the circuit layout of the substrate 2 and the circumferential bars 20, 21, as well as the supporting bars 22 are removed. According to an embodiment, for cost saving reasons, elimination of excess parts is usually executed through a punch. The leadframe 1 shown in FIG. 2 is depicted in FIG. 4 including a molded module housing 40.

Figure 4:
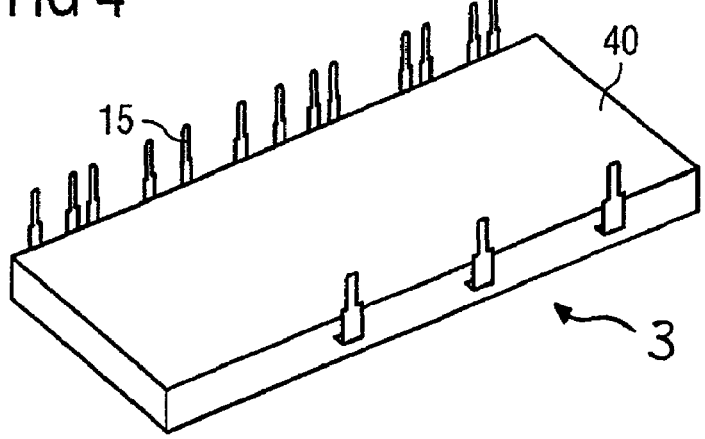
FIG. 4 is a 3D-view of a power semiconductor module including a module housing after completion of the molding procedure.
Figure 5:
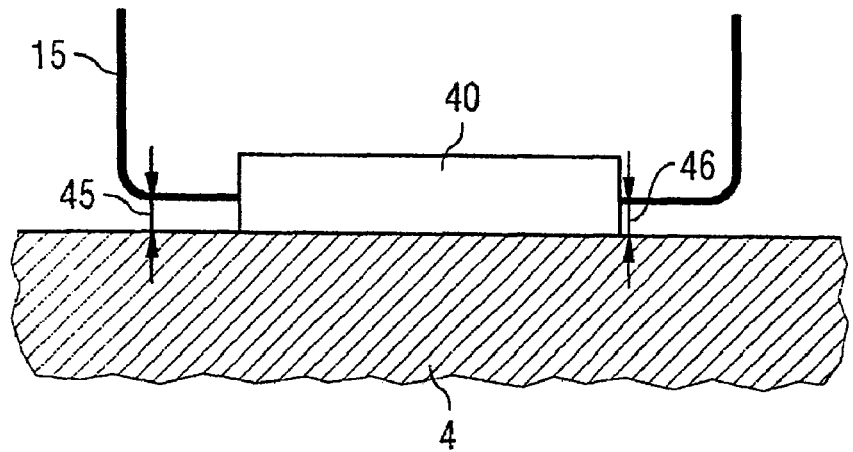
FIG. 5 is a cross section of a power semiconductor module mounted onto a cooling element.

According to an embodiment, the power semiconductor module 3 including a module housing 40 is mounted with its bottom side into a cooling element 4 (FIG. 4). According to an embodiment, the mounting is typically done by screwing or clamping. The cooling element 4 serves as a heat sink for dissipating of the power loss in the power semiconductor devices 5, 6, 7 generated during operation as heat. As shown in FIG. 5, according to an embodiment, the bottom side of the module housing fits closely and without a gap onto the cooling element 4 for an effective heat dissipation. A small heat transmission resistance results in a reliable operation of the power semiconductor module 3. For an effective heat dissipation, according to an embodiment, the area of the bottom side of the power semiconductor module 3 is large leading to a small height 41 of the module caused by the high costs of the synthetic material for the module housing 40.

According to an embodiment, the electrical contacts 15 of the power semiconductor module 3 are led out of the module housing 40 on the sides of the module housing 40 in a parallel to the bottom side of the module housing 40. For external electrical connections the electrical contacts 15 extend away from the cooling element 4 outside of the module housing 40 in an angle other than 180 degrees to the bottom side of the module housing 40. The electrical contacts 15 have rather small distance to the cooling element 4 just in that region outside of the module housing 40, in which the electrical contacts 15 are arranged in a parallel manner to the bottom side of the module housing 40.

According to an embodiment, the small distances of the electrical contacts 15 to the cooling element 4, often just a few millimeters down to less than one millimeter, lead to a small creepage distance 45 and a small air gap 46 resulting in small isolation distances. Power semiconductor modules 3 arranged on a cooling element as shown in FIG. 5 can operate only at reverse voltages around 600 V. For higher reverse voltages, particularly the widely used 1200 V class, cost and time consuming additional efforts for the power semiconductor module 3 are required.

According to an embodiment, measures for increasing the reverse voltage in power semiconductor modules include cut outs in the cooling element 4 in case of the module not isolated to the cooling element—frequently used when the leadframe is the only supporting carrier for the semiconductor devices. Isolating foils are used as well which adversely influence the thermal contact of the power semiconductor module to the cooling element. These isolating foils are usually located between the power semiconductor module bottom side and the cooling element 4. The thickness of the foils is several tenth of millimeter and the material may be Capton, Polyimide or any other electrically isolating material. Caused by the above mentioned additional isolating measures, IMT-manufactured power semiconductor modules mounted onto a cooling element are not used at applications involving reverse voltages in the range up to 1200 V.

Figure 6:
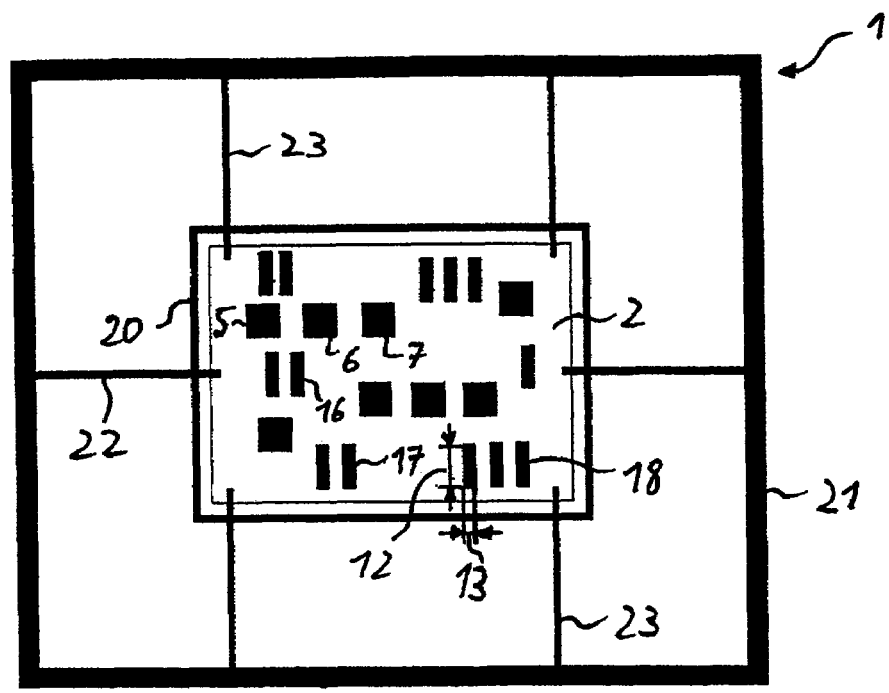
FIG. 6 is a plan view of a leadframe with a substrate and power semiconductor devices according to a power semiconductor module according to an embodiment prior to the molding procedure.

An example of a power semiconductor module according to an embodiment is shown in FIG. 6 which is a plan view of a substrate including power semiconductor devices 5, 6, 7, internal contacts 16, 17, 18, and a leadframe 1. The substrate 2 may be an Insulated metal substrate (IMS), a DCB-, AMB-, DAB-, or regular brazing type substrate or any other suitable kind of substrate. The internal contacts 16, 17, 18 replace the former electrical contacts 15 of the leadframe electrically connected to the longitudinal edges of the substrate 2 (see FIG. 1). The arrangements of the inner contacts 16, 17, 18 is such that the internal contacts 16, 17, 18 have large distances to each other for an effective electrical isolation.

The internal contacts of the power semiconductor module according to an embodiment do not extend away from the substrate 2 by means of electrical contacts to the leadframe 1 at the longitudinal edges of the substrate 2. Instead, the internal contacts 16, 17, 18 are located within the substrate area and extend away from the cooling element 4 in a direction perpendicular to the surface of the substrate 2. The internal contacts 16, 17, 18 protrude a module housing (not shown) on a side of the module housing opposite to the side of the module housing which faces the cooling element 4. The leadframe 1 holds the substrate 2 including the power semiconductor devices 5, 6, 7 and their internal contacts 16, 17, 18 in place during the IMT-molding process for manufacturing the module housing. The leadframe 1 is mechanically connected to the substrate 2 by the supporting bars 22, 23 and held outside the die for molding at the circumferential bar 21.

During the molding process the supporting bars 22, 23 mechanically connected to the substrate 2 and the circumferential bar 21 hold the circumferential bar 20 providing the seal between the upper and lower die of the die cast. The leadframe 1, not used for electrically contacting the power semiconductor devices 5, 6, 7 at the flat sides of the module and outside of the module housing, may be used for manufacturing the internal contacts 16, 17, 18 by punching and/or bending of parts of the leadframe 1. The internal contacts may be leads of the leadframe 1 as well. The surfaces of the internal contacts extending away from the surface of the substrate 2 may be of arbitrary shape as indicated in FIG. 6 by variable values for the length 12 and breadth 13 of the internal contacts 16 to 18. For a simplified circuit layout of the substrate 2, the circumferences of the surfaces of the internal contacts 16, 17, 18 may have a quadrangular (equal values for 12, 13) or rectangular (unequal values of 12, 13) shape. As shown in FIG. 6, the internal contacts 16, 17, 18 may have closed surfaces. For electrical connection of external contacts the internal contacts 16 to 18 may also have an even surface.

Figure 7:
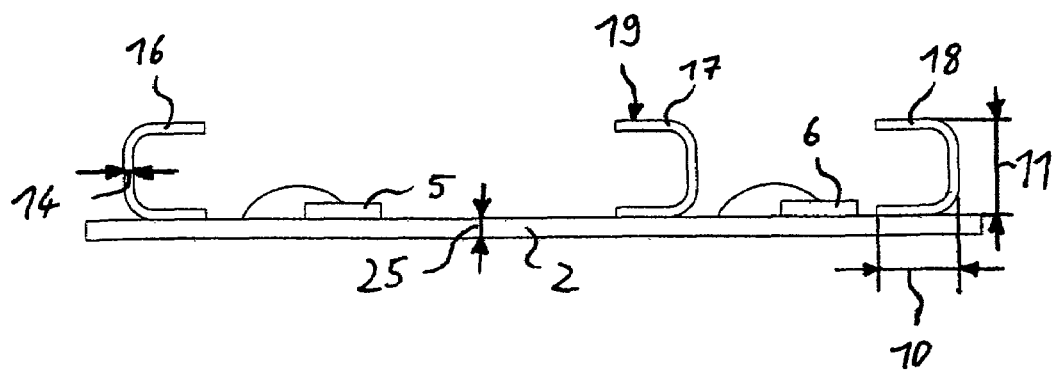
FIG. 7 is a cross sectional view of the substrate of FIG. 6 including U-shaped internal contacts in an example.

According to an embodiment, the power semiconductor module may comprise U-shaped internal contacts 16, 17, 18 as depicted in the cross sectional view of FIG. 7. The internal contacts 16, 17, 18 are evenly mounted onto the surface of the substrate 2 opposed to the cooling element the substrate 2 is subsequently mounted on (not shown). The U-shaped contacts 16, 17, 18 have a thickness 14, height 11 and surface 19 extending away from the surface of the substrate 2. The length 10 of the internal contacts 16, 17, 18 over which the internal contacts are electrically connected to the substrate 2 and the power semiconductor devices 5, 6 may be equal or different from the values for the surface length 12 and breadth 13 of the surface 19 of the internal contacts. The shape of the internal contacts 16, 17, 18 in FIG. 7 may be chosen such that the contacts 16, 17, 18 are mechanically stable when impacted by a pressure due to connection to external contacts onto the surface 19. Furthermore, the U-shape ensures that there is resilient behavior of the internal contacts 16, 17, 18 during their electrical connection to the substrate 2 and external electrical contacts (not shown).

Figure 8:
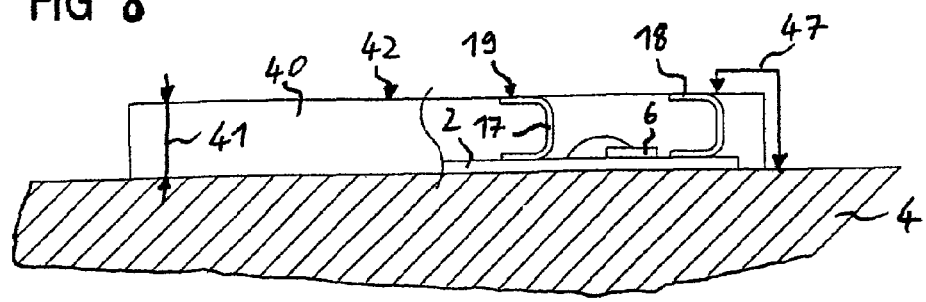
FIG. 8 is a cross sectional view of a power semiconductor module according to an embodiment including a module housing.

A cross sectional view of a power semiconductor module according to an embodiment comprising a module housing 40 and mounted onto a cooling element 4 is shown in FIG. 8. The power semiconductor module comprises a substrate 2, on which the power semiconductor devices 6 are located and a module housing 40 which at least partially surrounds the substrate 2. The power semiconductor module may also comprise more than one substrate. As shown in FIG. 8, the side 42 of the module housing 40 opposite to the side of the module housing 40 which faces the cooling element 4 has a sealed surface turned away from the power semiconductor module and the side 42 has openings which are completely filled with the internal contacts 17, 18. The internal contacts 17, 18 protrude the module housing 40 for electrically connecting the power semiconductor devices 6 with external contacts (not shown).

As the surfaces 19 of the internal contacts 17, 18 are located in the sealed surface of the side 42 of the module housing 40 opposite to the side of the module housing 40 which faces the cooling element 4, the creepage distances 47 are increased in comparison to the creepage distances 46 (as shown in FIG. 5). The air gap 45 of the conventional power semiconductor module mounted on a cooling element in FIG. 5 correspond to the creepage distance 47 and are increased as well. Due to the arrangement of the internal contacts 16, 17, 18 within the area of the substrate 2 and surface of the side 42 of the module housing 40 opposite to the side of the module housing 40 which faces the cooling element 4 it is possible to increase the reverse voltages to values larger than 600 volts. The reverse voltage can easily be influenced by the height 41 of the module housing 40 and the separation of the internal contact 16, 17, 18 from another and the edges of the substrate 2.

In case the top side of the substrate 2 turned away from a cooling element 4 has a surface which is oriented in parallel to the surface 42 of the side of the module housing 40 opposite to the side of the module housing 40 which faces the cooling element 4, and the internal contacts 16, 17, 18 being mounted onto said substrate surface, the heights 11 of the internal contacts 16, 17, 18 are equal (see FIG. 8). In case of a constant thickness 25 of the substrate 2 (see FIG. 7) and a constant height 41 of the module housing 40, the heights 11 of the internal contacts 17, 18, 19 are equal as well. Provided that the other sizes of the internal contacts 16, 17, 18 (10, 12, 13, 14) are equal, the internal contacts 16, 17, 18 can be mass produced.

The power semiconductor module of FIG. 8 mounted on a cooling element 4 is manufactured by providing at least one substrate 2, on which one ore more components 5, 6, 7 are mounted. The substrate 2 is put on a leadframe 1 having a circumferential bar 20 at the sealing edge of the molding apparatus. The at least one internal contact 16, 17, 18 is formed out of the leadframe 1 or by providing at least one additional contact 16, 17, 18 onto the substrate. Afterwards the leadframe is put with the substrate 2 including the components 5, 6, 7 into a lower die of the molding apparatus having an upper and lower die (see FIG. 3). A foil (not shown) is put at least onto the internal contacts 16, 17, 18 for protecting the surfaces 19 of the internal contacts 16, 17, 18. The foil may be temperature-resistant for the IMT-molding process including suitable materials for the foil such as Capton. The foil may not only cover the surfaces 19 of the internal contacts 16, 17, 18, but cover the whole surface of the substrate 2. In this case the size of the foil may be quadrangular and has an area of up to 55 mm² (see FIG. 6). Subsequently the lower die and the upper die are moved relative to one another. The module housing 40 is formed of a mold with opposite sides. A first side faces the cooling element 4 and a second side 42 has openings and a surface turned away from the power semiconductor module. Each of the openings in the side 42 of the module housing is sealed by internal contact 16, 17, and 18. Internal contacts 16, 17, and 18 are electrically connected to the components 5, 6, 7 and protrude the module housing 40, such that the internal contacts 16, 17, and 18 not extend beyond the surface of the side 42 turned away from the power semiconductor module. After formation of the module housing 40 the foil is removed from the surfaces 19 of the internal contacts 16, 17, 18 turned away from the substrate 2. For an effective electrical isolation the internal contacts 16, 17, 18 may be spaced relative to each other with large distances.

Figure 9:
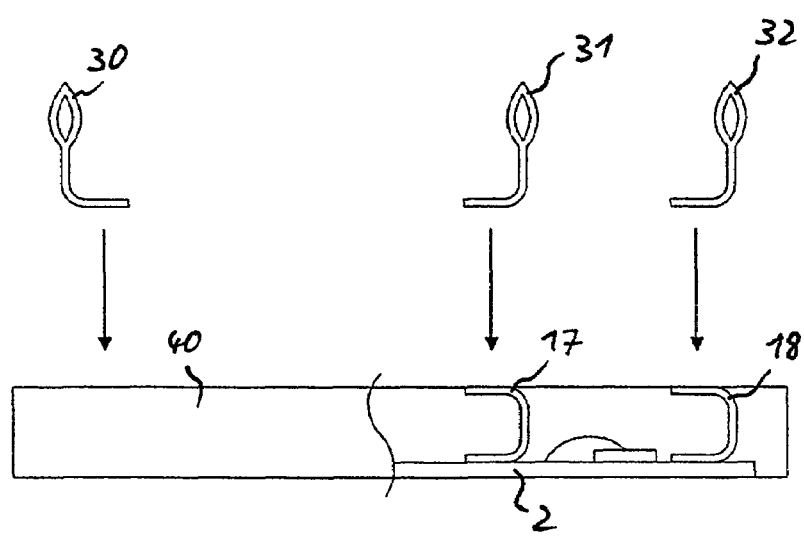
FIG. 9 is a cross sectional view of the power semiconductor module of FIG. 8 including external contacts in an example.

In the cross sectional view of a power semiconductor module of FIG. 9, external contacts 30, 31, 32 are shown. The external contacts 30, 31, 32 are electrically connected to the surfaces 19 of the internal contacts 16, 17, 18 by soldering, welding or application of an adhesive or the like. The external contacts 30, 31, 32 are electrically connected with one end to the surfaces 19 of each internal contact 16, 17, 18 while having another end suitable for soldering on or pressing into a circuit board (not shown). The shape of the ends of the external contacts 30, 31, 32 extending away from the surface 42 of the module housing 40 may be suitable not only for soldering or pressing, but any other kind of electrical connection technique.

Figure 10:
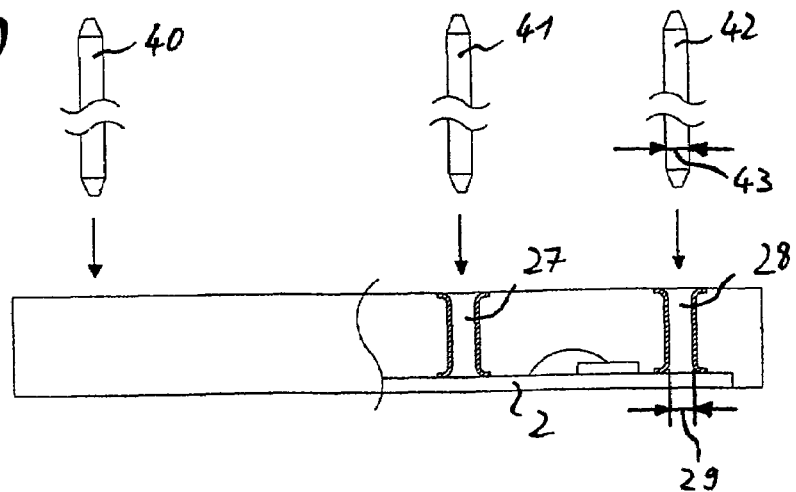
FIG. 10 is a cross sectional view of a power semiconductor module including jackets as internal contacts and pins as external contacts in a next example.

A cross sectional view of a power semiconductor module in a next example is shown in FIG. 10. The external contacts 27, 28 have the shape of a cylinder and are utilized in the power semiconductor module of FIG. 10 as sockets. The sockets 27, 28 may be used as receptacles. The receptacles 27, 28 may be used as jackets in which contact pins 40, 41, 42 are inserted. The outer diameter 43 of the electrical contact pins 40, 41, 42 allows that the electrical contact pins 40, 41, 42 may easily be stuck into the internal contact 27, 28. The inner diameter 29 of the internal contacts 27, 28 thus corresponds to the outer diameter 43 of the electrical contact pins 40, 41, 42. The materials for the electrical contact pins 40, 41, 42 may be any electrically conductive material such as copper, copper alloy or the like.

Figure 11:
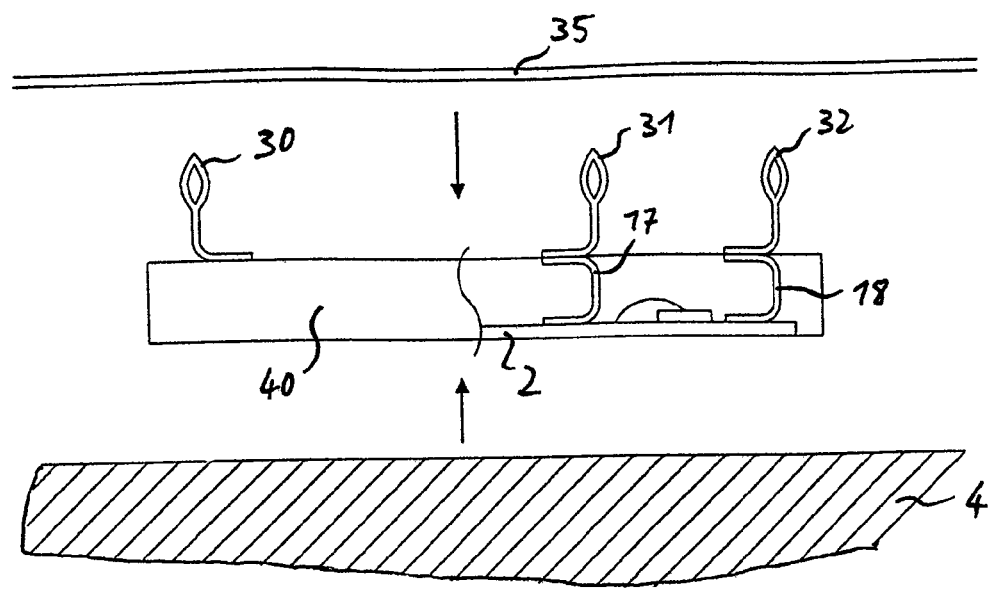
FIG. 11 is a cross sectional view of the power semiconductor module with external contacts of FIG. 9 sandwiched between a cooling element and a circuit board.

FIG. 11 shows the power semiconductor module of FIG. 9 including the external contacts 30, 31, 32 which are inserted into the circuit board 35. The force onto the external contacts 30, 31, 32 for pressing of the external contacts 30, 31, 32 into the circuit board 35 may range between 50 and 100 N. The shape of the external contacts 30, 31, 32 and the internal contacts 17, 18 may be chosen such that the force during pressing of the circuit board onto the external contacts 30, 31, 32 does not damage the internal contacts 17, 18, the external contacts 30, 31, 32 and the substrate 2. The surfaces 19 of the internal contacts 17, 18 and the surfaces of the internal contact 17, 18 in contact with the substrate 2 are chosen specifically to the application to avoid damages of the substrate 2 and the internal and external contacts as well.

Figure 12:
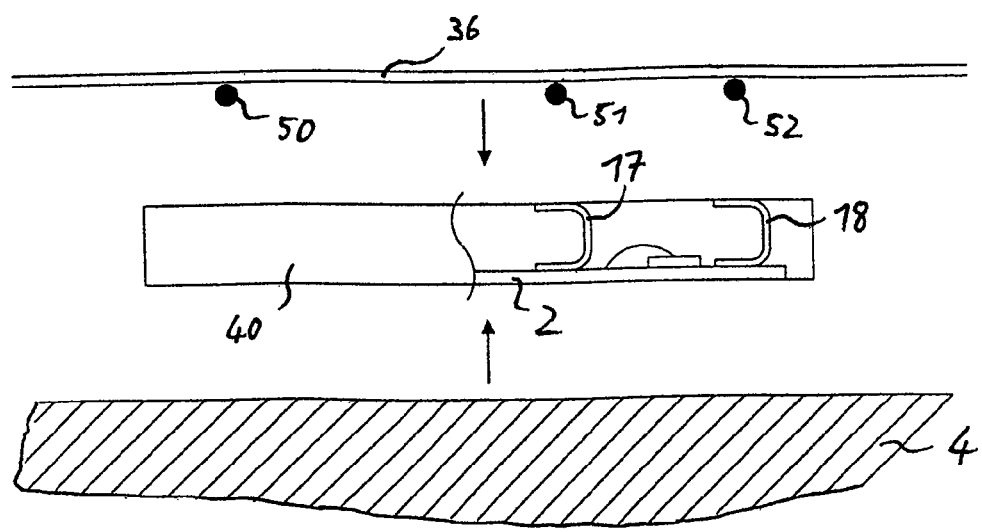
FIG. 12 is a cross sectional view of a power semiconductor module for mounting on a cooling element and a circuit board in surface mounting technology (SMT) in another example.

A cross sectional view of an arrangement of a circuit board 36 manufactured in surface mounting technology (SMT), a power semiconductor module including internal contacts 17, 18 on a substrate 2 and encapsulated in a module housing 40, and a cooling element 4 whereon the power semiconductor module is mounted on, is depicted in FIG. 12. In the example of a power semiconductor module of FIG. 12, the internal contacts 17, 18 are surface mounted device (SMD)-contacts which are electrically connected to the SMT-circuit board 36 by solder or an adhesive 50, 51, 52. Other electrical connection techniques may also be used. In case of using the internal contact 17, 18 as SMD-contacts, the surface area 19 and the geometric sizes 12, 13 of the internal contact 17, 18 correspond to the specifications of the SMT-mounting technique.

According to an embodiment, a power semiconductor module may comprise internal contacts of arbitrary shape which extend way from the surface of a substrate comprising power semiconductor devices. The internal contacts are mounted within the substrate area and protrude the module housing in a way such that the side of the module housing opposite to the side of the module housing which faces a cooling element has openings with borders which are sealed by internal contacts. Due to the location of the internal contacts within the substrate area and the internal contacts not extending beyond a surface of the side of module housing opposite to the side of the module housing which faces the cooling element the creepage distances and air gaps of the power semiconductor module are considerably increased compared to conventional power semiconductor modules.

What is claimed is:

1. A power semiconductor module to be mounted on a cooling element comprising:
at least one substrate carrying
one or more components, and
a module housing surrounding at least partially the at least one substrate, in which
the module housing has at least opposite sides with a first side facing the cooling element, and
a second side having one or more openings and a surface turned away from the power semiconductor module, wherein
each of the one or more openings has a border, which
is sealed by one internal contact, which
is electrically connected to the one or more components and protrudes the module housing, such that
the one internal contact not extends beyond said surface of the second side of the module housing.

2. The power semiconductor module of claim 1, wherein the internal contacts have large distances relative to each other for an effective electrical isolation.

3. The power semiconductor module of claim 1, wherein the substrate is a leadframe and the internal contacts are punched and/or bent parts of the leadframe.

4. The power semiconductor module of claim 3, wherein the internal contacts are leads of the leadframe.

5. The power semiconductor module of claim 1, wherein the substrate is an IMS-, a DCB-, an AMB-, a DAB-, or a regular brazing type substrate.

6. The power semiconductor module of claim 1, wherein the circumferences of the openings of the second side of the module housing are of quadrangular or rectangular shape.

7. The power semiconductor module of claim 6 wherein the surfaces of the internal contacts turned away from the substrate are even and closed.

8. The power semiconductor module of claim 7 wherein the surface of each internal contact turned away from the substrate is electrically connected to one end of an external contact which has another end suitable for soldering on or pressing into a circuit board.

9. The power semiconductor module of claim 8 wherein the force onto the external contacts for pressing of the external contact into a circuit board is between 50 and 100 N.

10. The power semiconductor module of claim 8 wherein the surfaces of the internal contacts turned away from the substrate are electrically connected to the external contacts by soldering I welding or application of an adhesive.

11. The power semiconductor module of claim 7 wherein the surfaces of the internal contacts turned away from the substrate are external SMD-contacts.

12. The power semiconductor module of claim 11 wherein the electrical connection of the SMD-contacts to an SMD-circuit board is made by solder or an adhesive.

13. The power semiconductor module of claim 1, wherein a foil is located onto the surfaces of the internal contacts turned away from the substrate for protection of the internal contacts during the manufacture of the module housing.

14. The power semiconductor module of claim 13, wherein the foil is temperature-resistant.

15. The power semiconductor module of claim 13, wherein the foil has a quadrangular shape and an area of up to 55 mm2.

16. The power semiconductor module of claim 1, wherein the internal contacts are generally U-shaped.

17. The power semiconductor module of claim 1, wherein the internal contacts comprise hollow cylinder-shaped receptacles.

* * * * *